United States Patent [19]

Bialas, Jr. et al.

[11] Patent Number: 5,525,923
[45] Date of Patent: Jun. 11, 1996

[54] SINGLE EVENT UPSET IMMUNE REGISTER WITH FAST WRITE ACCESS

[75] Inventors: John S. Bialas, Jr., South Burlington, Vt.; Joseph A. Hoffman, Manassas, Va.

[73] Assignee: Loral Federal Systems Company, McLean, Va.

[21] Appl. No.: 391,798

[22] Filed: Feb. 21, 1995

[51] Int. Cl.$^6$ .................................................. G11C 11/00
[52] U.S. Cl. .......................... 327/210; 327/218; 365/156
[58] Field of Search ..................................... 327/210, 199, 327/200, 201, 202, 203, 208, 211, 212, 214, 218; 365/154, 156

[56] References Cited

U.S. PATENT DOCUMENTS

| | | | |
|---|---|---|---|
| 4,707,626 | 11/1987 | Inoue | 327/365 |
| 4,725,875 | 2/1988 | Hsueh | 357/42 |
| 4,809,226 | 2/1989 | Ochoa | 365/156 |
| 4,816,706 | 3/1989 | Ohong et al. | 327/212 |
| 4,833,644 | 5/1989 | Plus et al. | 365/53 |
| 4,837,458 | 6/1989 | Kawahata et al. | 327/208 |
| 4,956,814 | 9/1990 | Houston | 365/154 |
| 5,018,102 | 5/1991 | Houston | 365/95 |
| 5,034,797 | 7/1991 | Yamanaka | 365/156 |
| 5,053,848 | 10/1991 | Houston et al. | 357/51 |
| 5,307,142 | 4/1994 | Corbett et al. | 365/156 |

OTHER PUBLICATIONS

Rainer Zuleeg, "Radiation Effec ts in GaAs FET Devices", Mar. 1989, Proceedings of the IEEE, vol. 77, No. 3, pp. 389–407.
H. T. Weaver, et al., "An SEU Tolerant Memory Cell Derived from Fundamental Studies of Mechanisms in SRAM", IEEE 1987.

Primary Examiner—Timothy P. Callahan
Assistant Examiner—Eunja Shin
Attorney, Agent, or Firm—Lane, Aitken, & McCann

[57] ABSTRACT

A single event upset hardened bi-stable CMOS circuit has a pair of cross coupled invertors with an isolation resistor in the path coupling the drains of the transistors in each invertor. Each invertor includes a PFET and a NFET pair coupled source to drain. An isolation resistor couples together the drains of each PFET-NFET pair and two low impedance conductive paths provide a direct coupling between the drains of each transistor of one invertor to common gate node of the other invertor.

4 Claims, 3 Drawing Sheets

SINGLE EVENT UPSET IMMUNE REGISTER WITH FAST WRITE ACCESS

BACKGROUND OF THE INVENTION

1. Field of the Invention

This invention relates to an improved radiation hardened CMOS register, and more particularly to a resistive hardening which does not adversely affect the register write time.

2. Description of the Prior Art

As will be appreciated by those skilled in the art, semiconductor data storage circuits struck by high energy particles in a space environment can lose data due to the ionizing effects of the impact. In the prior art, designs that add resistive coupling between stages of a bi-stable CMOS circuit have been used to provide hardening (i.e. immunity) to these so called single event upset (SEU) phenomena. The interstage resistive coupling is effective in providing hardening against upsets from high energy particles, but this approach increases the time to write data into the element. The prior art has also used circuit designs for hardening that do not use resistive interstage coupling.

FIG. 1 shows a common prior art resistive coupling approach to radiation hardening a CMOS random access memory (RAM) cell; see for example U.S. Pat. No. 5,053,848. Lightly doped polysilicon resistors 10 and 12 are formed in the feedback paths between the two CMOS invertors 14 and 16, which comprise the RAM cell.

FIG. 2 shows an unhardened prior art register element, typical of that used in commercial designs. CMOS transistors P1, N1 and P4, N4, are used to access data storage invertors P2-N2 and P3-N3 and to provide a regeneration feedback loop. When signals CLK and CLK* are active, write access to the data storage transistors is provided through an input D and a CMOS transmission gate P1-N1. With CLK and CLK* active, the feedback transistors, P4 and N4 are turned off, allowing the input at D to force nodes A, B, and C to the proper logic levels. When CLK and CLK* are inactive, access through P1 and N1 ceases, and the regenerative feedback from node C to node A is completed by the CMOS transmission gate formed by P4 and N4.

FIG. 3 shows a typical resistive approach to hardening the register element shown in FIG. 2. In this prior art approach, resistors A and B are inserted respectively into the inputs of each inverter, P2-N2 and P3-N3. Like the RAM cell shown in FIG. 1, this approach adversely affects the write time to the register, as the times required to charge nodes A and B are a function of the series resistance and gate capacitance of the inverter stages. Thus, the time discrimination function provided by the RC time constant provides SEU immunity, but adversely affects the write time.

Other techniques for providing SEU immunity, which do not rely on resistive induced delay for hardening, are also known in the prior art. These techniques provide a high level of SEU immunity without adversely affecting the write setup time as does resistive hardening. However, these other techniques increase transistor count, circuit complexity, and require more silicon area.

SUMMARY OF THE INVENTION

An object of this invention is to provide SEU immunity in a CMOS data storage element without adversely affecting the time to write data into the circuit.

Briefly, this invention contemplates the provision of a single event upset hardened bi-stable CMOS circuit comprised of a pair of cross coupled invertors with an isolation resistor in the path coupling the drains of the transistors in each invertor. Each invertor includes a PFET and a NFET pair coupled source to drain. An isolation resistor couples together the drains of each PFET-NFET pair and two low impedance conductive paths provide a direct coupling between the drains of each transistor of one invertor to common gate node of the other invertor. The resistors temporally isolate nodes that may be struck by an ionizing particle, but do not create a time delay in the write data path.

BRIEF DESCRIPTION OF THE DRAWINGS

The foregoing and other objects, aspects and advantages will be better understood from the following detailed description of a preferred embodiment of invention with reference to the drawings, in which.

DETAILED DESCRIPTION OF A PREFERRED EMBODIMENT OF THE INVENTION

Figure 1:
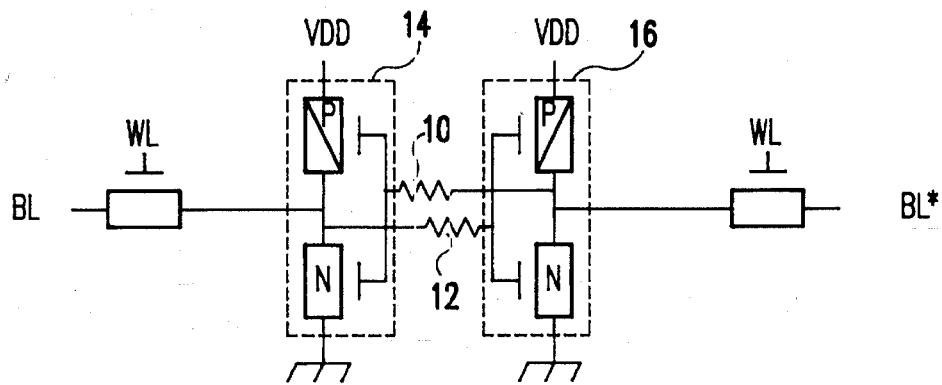
FIG. 1 is a schematic drawing of a prior art resistively hardened CMOS RAM storage element.
Figure 2:
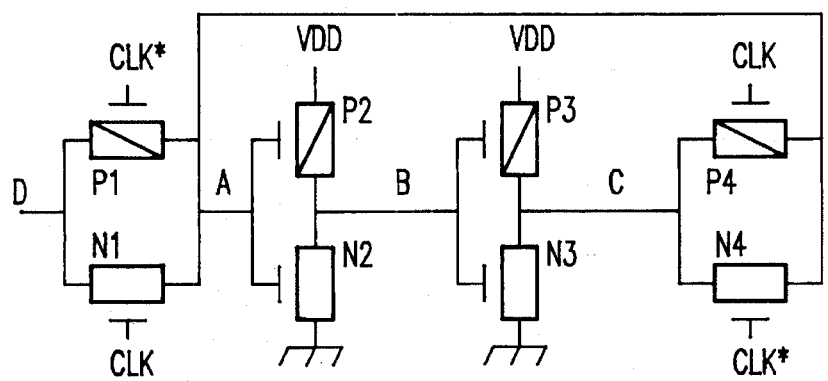
FIG. 2 is a schematic drawing of a prior art unhardened CMOS register storage element.
Figure 3:
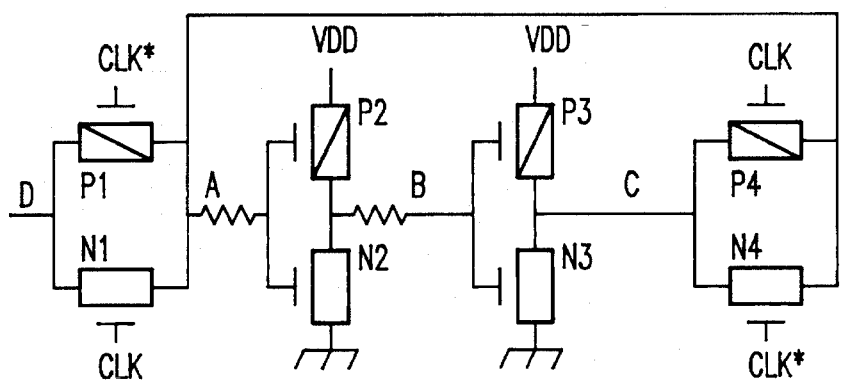
FIG. 3 is a schematic drawing of circuit shown in FIG. 2 resistively hardened in accordance with the prior art.
Figure 4:
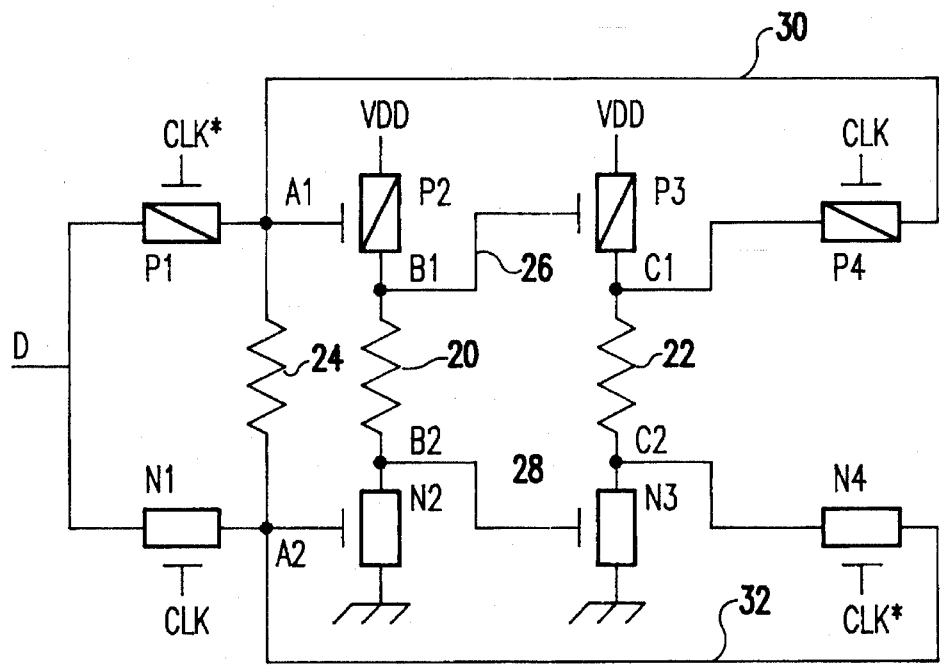
FIG. 4 is a schematic drawing of the circuit shown in FIG. 2 resistively hardened in accordance with the teachings of this invention.

Referring now to FIG. 4, the hardened CMOS register circuit shown in this Figure is, except for hardening resistors 20, 22, and 24, the same as the prior art register circuit shown in FIG. 2 whose operation is well known and has been generally described in connection with FIG. 2. Here, it should be noted, temporal isolation of the effects of a particle strike are provided by isolation resistors between the PMOS drain and the NMOS drain of each transistor in the storage register. Specifically, resistor 20 provides isolation between FET transistors P2 and N2; resistor 22 provides isolation between FET transistors P3 and N3; and resistor 24 provides isolation between FET transistors P4 and N4 and between transistors P1 and N1. Signal paths free of the isolation resistors are provided between stages. Specifically, signal path 26 couples the drain of transistor P2 directly to the gate of transistor P3 and signal path 28 couples the drain of transistor N2 directly to the gate of transistor N3. Similarly, a signal path 30, which includes transistor P4, couples the drain of transistor P3 to the gate of transistor P2 and signal path 32, which includes transistor N4, couples the drain of transistor N3 to the gate of transistor N2. Thus, it will be appreciated, the signal paths do not include the isolation resistors and the isolation resistors do not affect the write setup time of the register; i.e. the time that is required to change the state of the register. In addition it should be noted that the CMOS transmission gates P1-N1 and P4-N4 simultaneously write to the nodal pairs A1-A2, B1-B2, and C1-C1, bypassing the isolating resistors during write operations.

Figure 5:
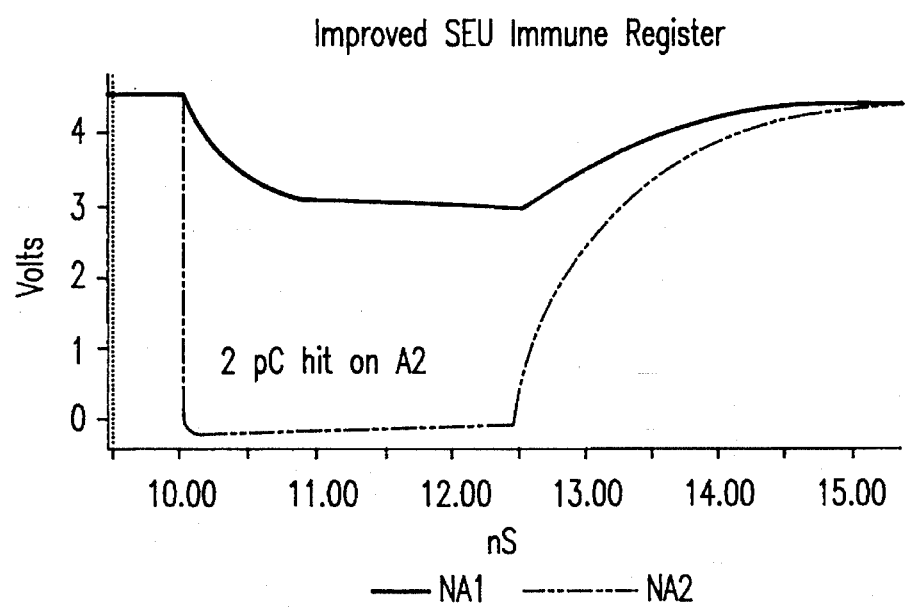
FIG. 5 is a graph showing the response of nodes A1 and A2 of FIG. 4 in response to a potential SEU particle strike affecting node A2.

Referring now to FIG. 5 in addition to FIG. 4, to illustrate the immunity provided by the isolation resistors 20, 22, and 24, consider a situation where data is stored in the register represented as a signal of VDD potential at logical equivalent nodes A1 and A2. The opposite logic state is represented as ground potential at the logically equivalent nodes B1 and B2. After data has been written into the register cell, nodes C1 and C2 are at the same potential as nodes A1 and A2; i.e. in this example A1 and A2 are at a logic 1 state, represented by potential level VDD. A potential SEU producing strike in this state can occur on N diffusions, principally the diffusions associated with N1, N3, and N4. The N diffusion associated with transistor N2 will in this state be at ground potential and is not susceptible to a strike. As illustrated in FIG. 5, a 2 pC strike affecting node A2 causes sharp drop in the potential of node A2 as a result of the strike, but node A1 is pulled down only by a small amount due to the isolation resistor 24 before the potential at A2 is restored and the register does not upset or lose data.

Figure 6:
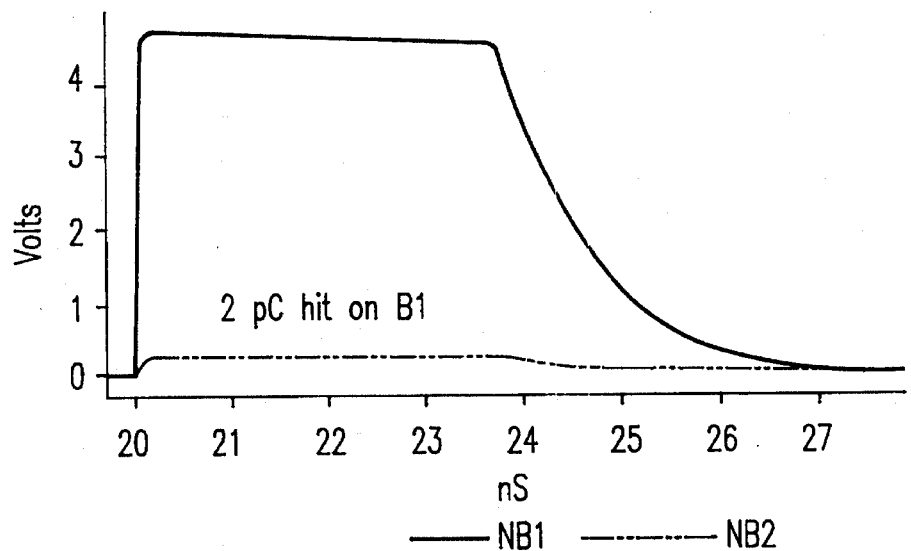
FIG. 6 is a graph similar to FIG. 5 showing the response of nodes B1 and B2 to a strike affecting node B1.
Figure 7:
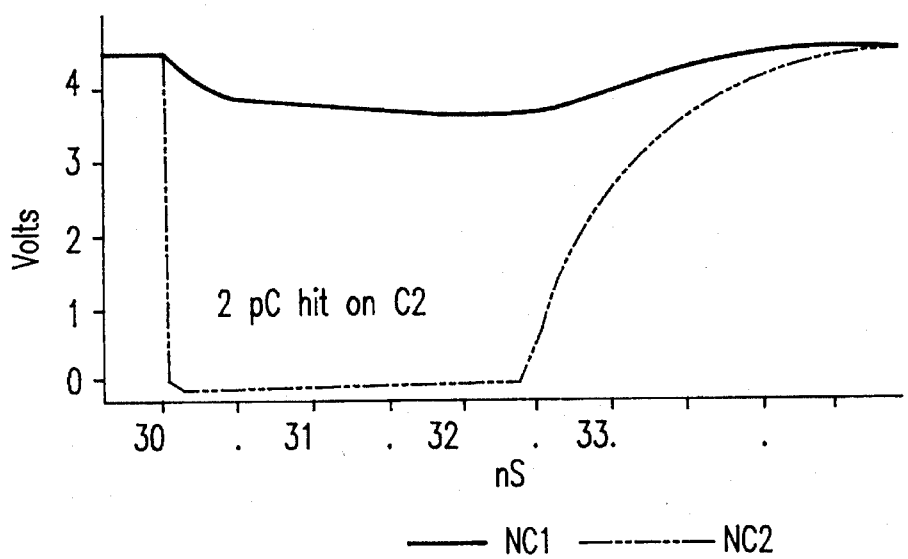
FIG. 7 is a graph similar to FIGS. 5 and 6 showing the response of nodes C1 and C2 to a strike affecting node C2.

FIGS. 6 and 7 illustrate the resulting changes in node voltage from a 2 pC strike affecting nodes B1 and C2 respectively. As shown in FIG. 6, a strike causing node B1 to rise from essential ground potential to close to VDD does not pull up node B2 and there is no upset of the register. Similarly, as shown in FIG. 7, a strike causing node C2 to drop does not pull down node C1 within the roughly 3 nano second period it takes node C2 to recover.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A single event upset hardened bi-stable circuit comprising in combination:

a first complementary pair of CMOS semiconductor transistors including a first PMOS transistor and a first NMOS transistor with a first isolation resistor coupling a drain node of said first PMOS transistor to a drain node of said first NMOS transistor;

a second complementary pair of CMOS semiconductor transistors including a second PMOS transistor and a second NMOS transistor with a second isolation resistor coupling a drain node of said second PMOS transistor to a drain node of said second NMOS transistor;

first low impedance means coupling said drain node of said first PMOS transistor to a gate of said second PMOS transistor;

second low impedance means coupling said drain node of said first NMOS transistor to a gate of said second NMOS transistor;

third low impedance means coupling said drain node of said second PMOS transistor to a gate of said first PMOS transistor;

fourth low impedance means coupling said drain node of said second NMOS transistor to a gate of said first NMOS transistor;

write input means coupled to a gate electrode of said first PMOS transistor and a gate electrode of said first NMOS transistor.

2. A single event upset hardened bi-stable circuit as in claim 1, wherein said first isolation resistor and said second isolation resistor limit a change in potential at one node of said first complementary pair of CMOS semiconductor transistors and said second pair of complementary CMOS semiconductor transistors, respectively due to a particle strike caused change of potential in a corresponding node of said first complementary pair of CMOS semiconductor transistors and said second pair of complementary CMOS semiconductor transistors, respectively.

3. A single event upset hardened bi-stable circuit as in claim 1 wherein said write input means includes a first pair of CMOS transmission gates and a second pair of CMOS transmission gates to write to said first complementary pair of CMOS semiconductor transistors and said second pair of CMOS semiconductor transistors, bypassing said first isolation resistor and said second isolation resistor during write operations.

4. A single event upset hardened bi-stable circuit as in claim 2 wherein said write input means includes a first pair of CMOS transmission gates and a second pair of CMOS transmission gates to write to said first complementary pair of CMOS semiconductor transistors and said second pair of CMOS semiconductor transistors, bypassing said first isolation resistor and said second isolation resistor during write operations.

* * * * *